United States Patent
Hosaka (10) Patent No.: US 9,378,993 B2
(45) Date of Patent: Jun. 28, 2016

(54) WAFER-RELATED DATA MANAGEMENT METHOD AND WAFER-RELATED DATA CREATION DEVICE

(71) Applicant: FUJI MACHINE MFG. CO., LTD., Chiryu (JP)

(72) Inventor: Hideki Hosaka, Chiryu (JP)

(73) Assignee: FUJI MACHINE MFG. CO., LTD., Chiryu (JP)

( * ) Notice: Subject to any disclaimer, the term of this patent is extended or adjusted under 35 U.S.C. 154(b) by 170 days.

(21) Appl. No.: 14/355,677

(22) PCT Filed: Oct. 30, 2012

(86) PCT No.: PCT/JP2012/078039
§ 371 (c)(1),
(2) Date: May 1, 2014

(87) PCT Pub. No.: WO2013/073365
PCT Pub. Date: May 23, 2013

(65) Prior Publication Data
US 2014/0299277 A1    Oct. 9, 2014

(30) Foreign Application Priority Data
Nov. 18, 2011 (JP) ................... 2011-252307

(51) Int. Cl.
*H01L 21/677* (2006.01)
*B32B 43/00* (2006.01)
(Continued)

(52) U.S. Cl.
CPC ............ *H01L 21/677* (2013.01); *B32B 43/006* (2013.01); *H01L 21/67132* (2013.01);
(Continued)

(58) Field of Classification Search
CPC ............... H01L 2221/68381; Y10T 156/1132; Y10T 156/1179; Y10T 156/1944; Y10S 156/932; Y10S 156/943; B32B 43/006
See application file for complete search history.

(56) References Cited

U.S. PATENT DOCUMENTS 5,570,293 A * 10/1996 Tanaka ................ H01L 21/6836
235/375
5,851,848 A    12/1998 Balamurugan
(Continued)

FOREIGN PATENT DOCUMENTS

| JP | 2001 21617 | 1/2001 |
| JP | 4262232 | 5/2009 |

(Continued)

OTHER PUBLICATIONS

Extended European Search Report issued Mar. 26, 2015 in Patent Application No. 12849642.9.
(Continued)

*Primary Examiner* — Mark A Osele
(74) *Attorney, Agent, or Firm* — Oblon, McClelland, Maier & Neustadt, L.L.P.

(57) ABSTRACT

A wafer-related data creation device including a setting stand for setting wafer pallets, a test-use suction nozzle for picking up die on dicing sheet of a wafer pallet set on the setting stand, a test-use pusher pin for pushing up the adhesive section of die from dicing sheet which is being attempted to be picked up by test-use suction nozzle, and a test-use camera for capturing an image of die on dicing sheet is used. The wafer pallet for which wafer-related data is to be created is set on the setting stand of wafer-related device creation device, an image captured by test-use camera is processed, pusher movement of test-use pusher pin and die pickup movement of test-use pickup nozzle is performed, and wafer-related data is created.

9 Claims, 10 Drawing Sheets

(51) Int. Cl.
  *H01L 21/67*    (2006.01)
  *H01L 21/68*    (2006.01)
  *G01R 31/28*    (2006.01)

(52) U.S. Cl.
  CPC ........ *H01L21/67724* (2013.01); *H01L 21/681* (2013.01); *G01R 31/2893* (2013.01); *H01L 2221/68381* (2013.01); *Y10S 156/932* (2013.01); *Y10S 156/943* (2013.01); *Y10T 156/1132* (2015.01); *Y10T 156/1179* (2015.01); *Y10T 156/1944* (2015.01); *Y10T 156/1983* (2015.01)

(56) References Cited

U.S. PATENT DOCUMENTS

| | | | |
|---|---|---|---|
| 6,016,358 A | 1/2000 | Balamurugan | |
| 6,149,047 A | 11/2000 | Oda | |
| 6,249,943 B1 * | 6/2001 | Matsushita | H01L 21/67132 156/522 |
| 6,946,311 B2 * | 9/2005 | Kawashima | H01L 21/67132 438/113 |
| 8,192,578 B2 * | 6/2012 | Haji | H01L 21/67092 156/707 |
| 9,229,058 B2 * | 1/2016 | Ohmart | G01R 31/318511 |
| 2008/0057599 A1 * | 3/2008 | Kobashi | H01L 21/67132 438/15 |
| 2009/0146786 A1 | 6/2009 | Toma et al. | |
| 2011/0038694 A1 * | 2/2011 | Khoo | H01L 21/67271 414/222.01 |

FOREIGN PATENT DOCUMENTS

| | | |
|---|---|---|
| JP | 2010 129949 | 6/2010 |
| JP | 2010 212358 | 9/2010 |
| JP | 2011 119364 | 6/2011 |
| JP | 2013-110182 A | 6/2013 |

OTHER PUBLICATIONS

International Search Report Issued Jan. 29, 2013 in PCT/JP12/078039 Filed Oct. 30, 2012.

* cited by examiner

(b) Automatic count of quantity of rows and columns of dies (a) Top view

WAFER-RELATED DATA MANAGEMENT METHOD AND WAFER-RELATED DATA CREATION DEVICE

TECHNICAL FIELD

The present invention relates to a wafer-related data creation device and wafer-related data management method for managing wafer-related data used in a die supply device.

BACKGROUND ART

In recent years, as disclosed in Patent Literature 1 (Japanese Unexamined Patent Application Publication Number 2010-129949), there are items for setting die supply devices which supply dies onto component mounters and mounting the dies onto circuit boards using component mounters. A die supply device comprises a wafer pallet stretched across which is a stretchable dicing sheet on which is affixed a wafer which has been diced to be divided into multiple dies, and a pusher pot arranged below the dicing sheet, so that when pickup is performed by lowering a suction nozzle and picking up a die on the dicing sheet, the pusher pot is raised to a specified holding position at which it contacts the underside of the dicing sheet so that with the dicing sheet being held to the upper surface of the pusher pot, a pusher pin in the pusher pot is protruded out in the up direction from the upper surface of the pusher pot, by which the adhesive section of the die on the dicing sheet which is being attempted to be picked up is raised by the pusher pin so that pickup is performed by picking up the die from the dicing sheet with the suction nozzle while partially separating the die adhesive section from the dicing sheet.

CITATION LIST

Patent Literature

Patent Literature 1: Japanese Unexamined Patent Application Publication Number 2010-129949
Patent Literature 2: Japanese Patent Publication Number 4262232

SUMMARY OF INVENTION

Problem to be Solved by the Invention

However, when lowering the suction nozzle to pick up the die on the dicing sheet, if the push amount of the pusher pin is too large, or the push speed is too fast, the lower tip of the suction nozzle contacts the die on the dicing sheet too strongly, thereby possibly damaging or breaking the die; and conversely, if the push amount of the pusher pin is too small, the die cannot be picked up stably on the suction nozzle. Also, if the push speed of the pusher pin is too slow, productivity is lowered. Therefore, in order to stably pick up dies on suction nozzles without damaging the dies while maintaining productivity, it is necessary to suitably manage die pickup conditions and push conditions such as push speed and push amount of pusher pins. Also, when pushing up very small dies with pusher pins, accurately recognizing the position of each die on the dicing sheet using image processing, and managing precisely the position of pusher pins in the horizontal direction (XY direction) are necessary.

Therefore, before starting production, the wafer pallet to be used in production is set in the die supply device, processing of an image captured by a camera, push movement of a pusher pin, and die pickup movement of a suction nozzle are performed, so that wafer-related data (data related to items such as, for example, push conditions, die pickup conditions, image processing conditions, and pickup starting position) setup can be performed.

However, with this method, for wafer-related data setup, it is always necessary to use a die supply device, so that for each new type of wafer that is attempted to be supported, the component mounting line must be stopped each time, which is bad for efficiency in forms of production with many changeovers.

Also, after setting the wafer pallet on the die supply device, it is necessary to perform work such as checking the pickup starting position, which has the drawbacks of requiring the intervention of an operator and making it not possible to perform non-stop replenishment of wafer pallets.

Therefore, in order to perform efficient changeover, it is necessary to have a feature which is capable of performing preparations (wafer-related data setup) for the next changeover during production.

For this, in Patent Literature 2 (Japanese Patent Publication Number 4262232), a measuring device for measuring the space between dies using image processing offline (outside the machine) is disclosed, but this measuring device is not equipped with a pusher pin or suction nozzle, so in order to perform setup of data related to die pickup movement of the suction nozzle and push movement of the pusher pin, it is necessary to use an actual die supply device which is within a component mounting line, so the situation of bad efficiency for forms of production with many changeovers does not change.

With respect to this, for the problem to be solved by this invention, what is proposed is a wafer-related data management method and wafer-related data creation device which is capable of performing setup of data related to die pickup movement of a suction nozzle and push movement of a pusher pin of a die supply device offline.

Means for Solving the Problem

To solve the above problem, the present invention is characterized in that: for a wafer-related data management method which manages the wafer-related data used by the die supply device which performs pickup by picking up a die from a dicing sheet with a suction nozzle while partially separating the adhesive section of the die from the dicing sheet by using a pusher pin to raise the adhesive section of the die on the dicing sheet which is being attempted to be picked up, which is done when performing pickup by picking up a die on the dicing sheet by lowering the suction nozzle, after setting a wafer pallet stretched across which is a stretchable dicing sheet on which is affixed a wafer which has been diced so that multiple dies are divided, and performing image recognition of the position of the die by capturing an image of the die on the dicing sheet with a camera; it uses a wafer-related data creation device comprising a setting stand for setting the wafer pallet which is the target for the wafer-related data creation, a test-use suction nozzle for picking up the die on the dicing sheet of the wafer pallet set on the setting stand, a test-use pusher pin for pushing up the adhesive section of the die on the dicing sheet which is being attempted to be picked up by the test-use suction nozzle, and a test-use camera for capturing images of the die on the dicing sheet; the wafer pallet which is the target for the wafer-related data creation is set on the setting stand of the wafer-related data creation device, the image captured by the test-use camera is processed, push movement of the test-use pusher pin and die pickup movement of the test-use suction nozzle are performed, and the wafer-related data is created (setup).

As in the present invention, if wafer-related data is created using a wafer-related data creation device equipped with a test-use pickup nozzle, test-use pusher pin, and test-use camera, data related to push movement of the pusher pin and die pickup movement of the suction nozzle can be set up offline, preparation (wafer-related data setup) for the next changeover can be performed during production, and productivity can be improved.

In this case, it is acceptable if wafer-related data includes at least one of: data related to image processing (size of die and wafer, number of rows and columns of dies and so on), data related to pusher pin push movement (push-related data such as push amount, push profile, pusher pin shape, pin arrangement and so on), and data related to die pickup movement of the suction nozzle (die pickup starting position on the dicing sheet and so on).

Also, it is acceptable for the wafer pallet to be equipped with a pallet ID memory section with the wafer pallet identification information (hereafter referred to as "pallet ID") recorded or memorized, a data management server for memorizing and creating a link between wafer-related data created in the wafer-related data creation device and the pallet ID to be connected via a network to the component mounting line in which the die supply device is arranged, the component mounting line or die supply device to be equipped with a pallet ID reading means for reading the pallet ID from the pallet ID memory section of the wafer pallet, and to control the die supply device by searching for the wafer-related data corresponding to the pallet ID read by the pallet ID reading means from the memorized data of the data management server and transmitting it to the die supply device.

Here, the pallet ID memory section can be an item with codes such as barcodes or 2D codes memorized, or it can use RF tags (also known as electronic tags, IC tags, radio tags, wireless tags) for memorizing electronically, or magnetic tape for memorizing magnetically and so on. If the wafer-related data created in the wafer-related data creation device is linked to the pallet ID and memorized in the data management server, the wafer-related data corresponding to the pallet ID of the wafer pallet set in the die supply device in the component mounting line can be searched from the memorized data of the data management server and automatically downloaded to the die supply device, the work of entering the wafer-related data which corresponded to the pallet ID into the die supply device can be automated, and the demand to save labor can be met.

In this case, it is acceptable to connect via a network the data management server to only one component mounting line, or it is acceptable to connect via a network the data management server to multiple component mounting lines. By doing this, it becomes possible to share wafer-related data created in the wafer-related data creation device with multiple component mounting lines, so it is not necessary to create wafer-related data in a wafer-related creation device separately for each component mounting line, and wafer-related data setup time can be reduced.

Alternatively, it is acceptable for the wafer pallet to be equipped with a data memorizing means for memorizing wafer-related data created in the wafer-related data creation device, the component mounting line or die supply device to be equipped with a data reading means for reading the wafer-related data from the data memorizing means of the wafer pallet, and to use the wafer-related data read by the data reading means to control the die supply device. In this way also, the work of entering the wafer-related data which corresponded to the pallet ID into the die supply device can be automated, and the demand to save labor can be met.

BRIEF DESCRIPTION OF DRAWINGS

FIG. 7($a$) is a top view showing the positional relationship between the wafer pallet, the XY moving mechanism which holds the test-use camera, and the pickup head of the wafer-related data creation device; (b) is a top view of the wafer pallet to illustrate the automatic counting method of the number of rows and columns of dies.

FIG. 8($a$) to ($d$) are diagrams to illustrate the tuning method of the push-related data related to pusher pin pusher movement.

FIG. 10($a$) to ($c$) are diagrams to illustrate the setting method of the pickup starting position.

DESCRIPTION OF EMBODIMENTS

The following describes two modes for carrying out the invention, embodiment 1 and embodiment 2.

Embodiment 1

This describes embodiment 1 of the present invention referring to FIG. 1 to FIG. 10. First, the configuration of the wafer-related data management system of embodiment 1 is described using FIG. 1.

Figure 1:
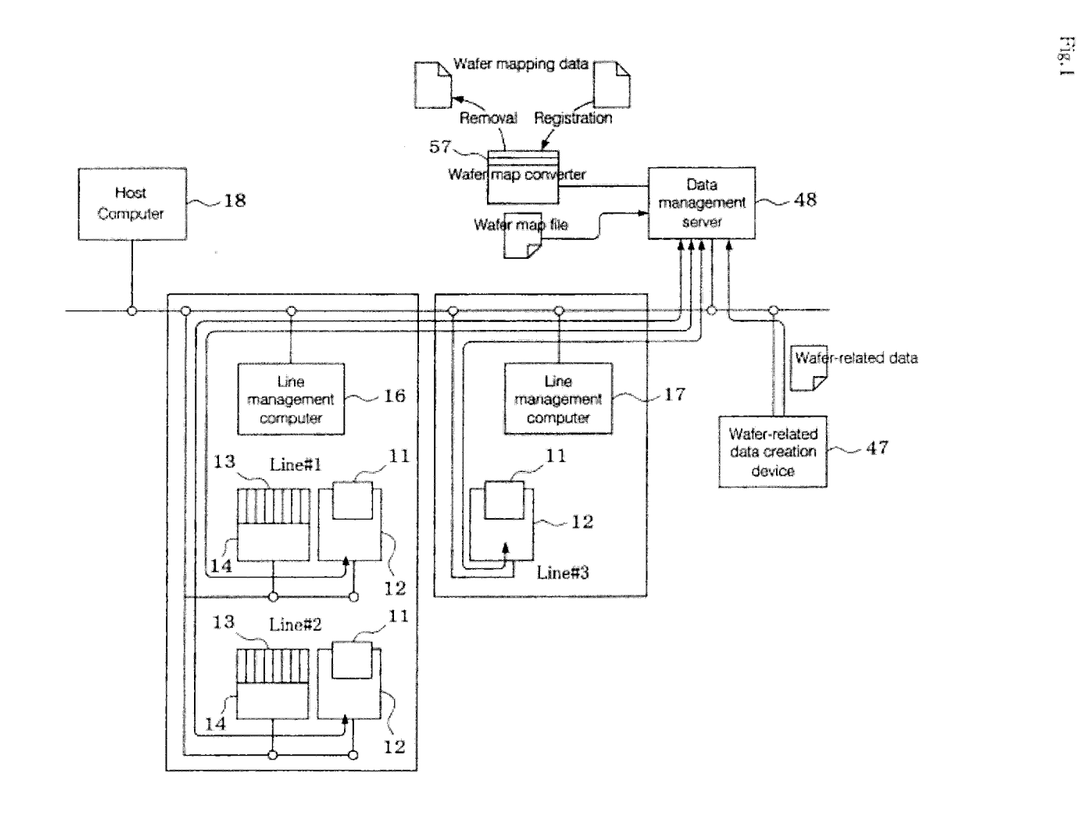
FIG. 1 is a block diagram showing a configuration example of the wafer-related data management system for embodiment 1 of the present invention.

In FIG. 1, three component mounting lines, Line #1, Line #2, and Line #3, are shown diagrammatically.

In each of the component mounting lines Line #1, Line #2, and Line #3, respectively arranged are one or multiple mounters 12 on which die supply device 11 is set and mounters 14 on which tape feeders 13 are set. In each of the component mounting lines Line #1, Line #2, and Line #3, in addition to mounters it is also acceptable to have solder printers, inspection machines, reflow ovens and so on arranged.

Each machine in component mounting lines Line #1 and Line #2 is connected via a network to line management computer 16, and production management is performed by line management computer 16. Each machine in component mounting line Line #3 is connected via a network to line management computer 17, and production management is performed by line management computer 17. Line management computers 16 and 17 are connected via a network to host computer 18, and thereby production of each component mounting line Line #1, Line #2, and Line #3 is managed.

Figure 2:
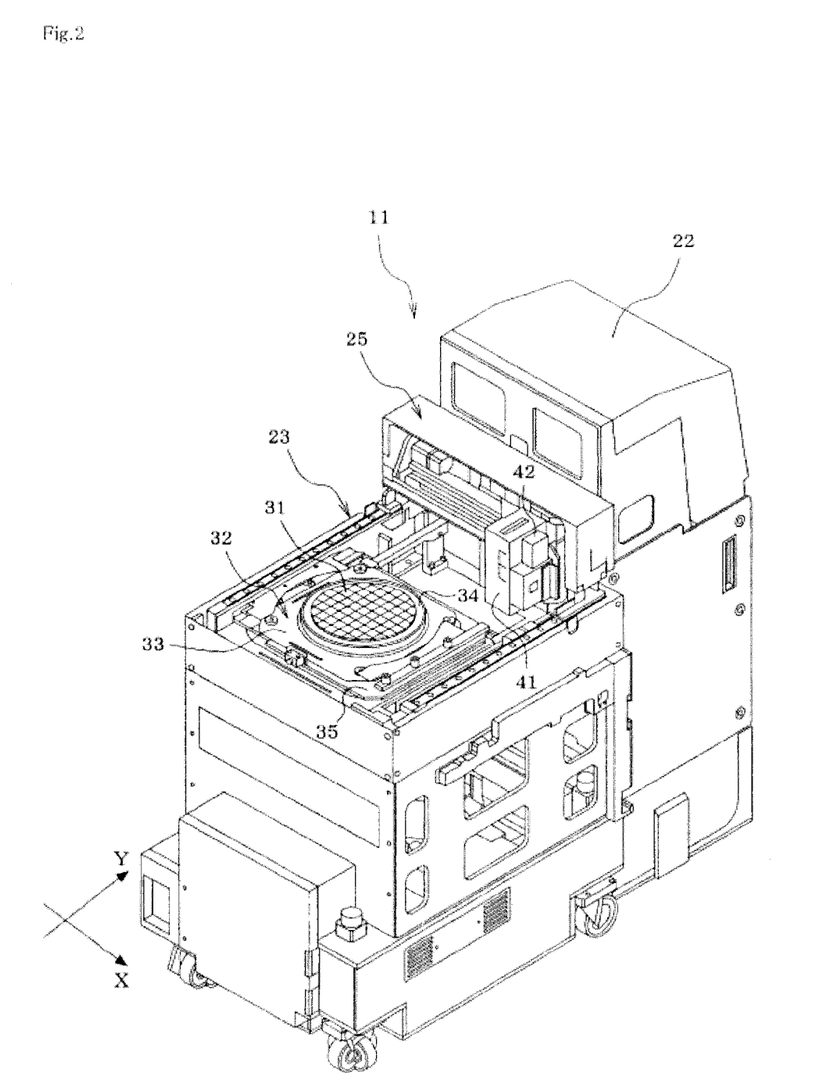
FIG. 2 is an exterior perspective view of the die supply device.
Figure 3:
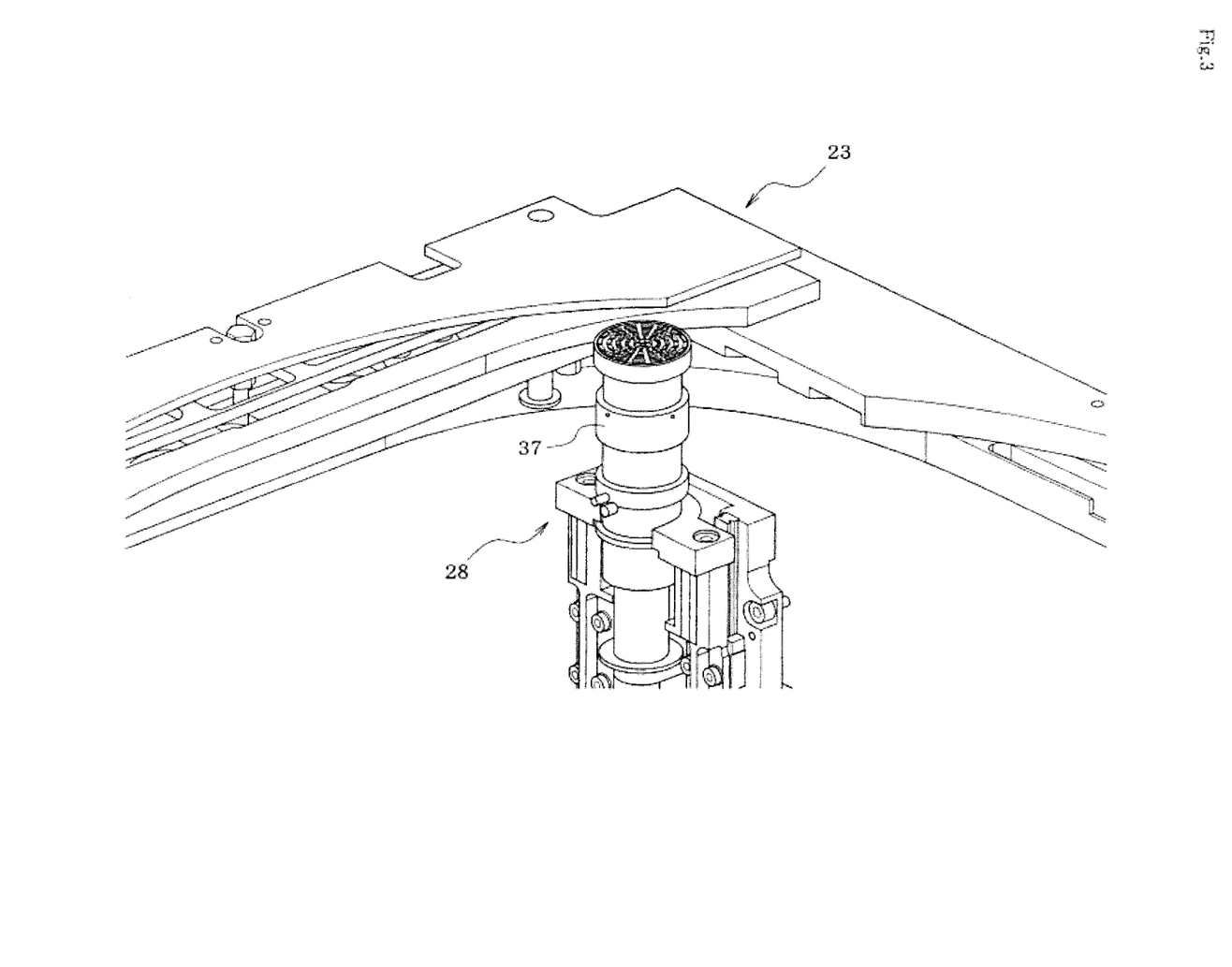
FIG. 3 is an exterior perspective view of the pusher unit and the surrounding sections.

Next, the configuration of die supply device 11 is described in summary using FIG. 2. Die supply device 11 comprises magazine holding section 22 (tray tower), pallet withdrawal table 23, XY moving mechanism 25, and pusher unit 28 (refer to FIG. 3) and so on, and is set in a state with pallet withdrawal table 23 inserted into mounter 12 (refer to FIG. 1).

Figure 4:
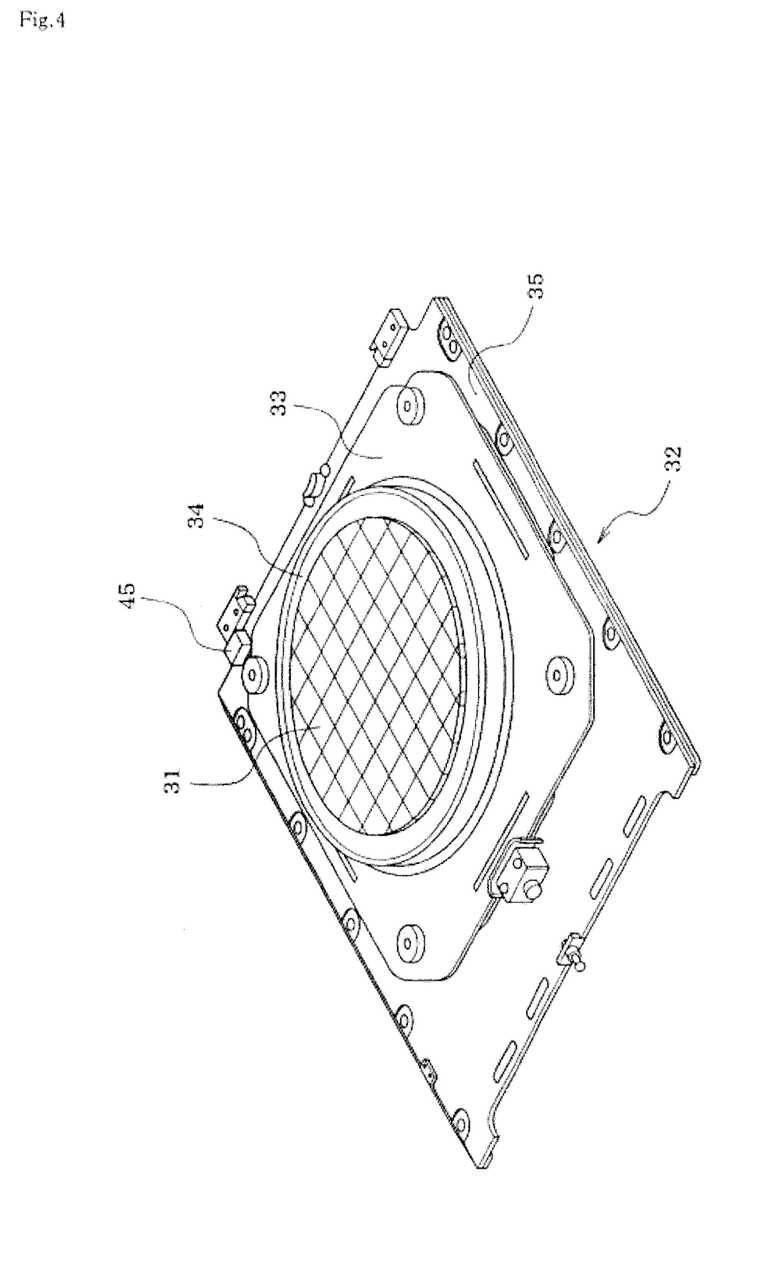
FIG. 4 is an exterior perspective view of the wafer pallet.
Figure 5:
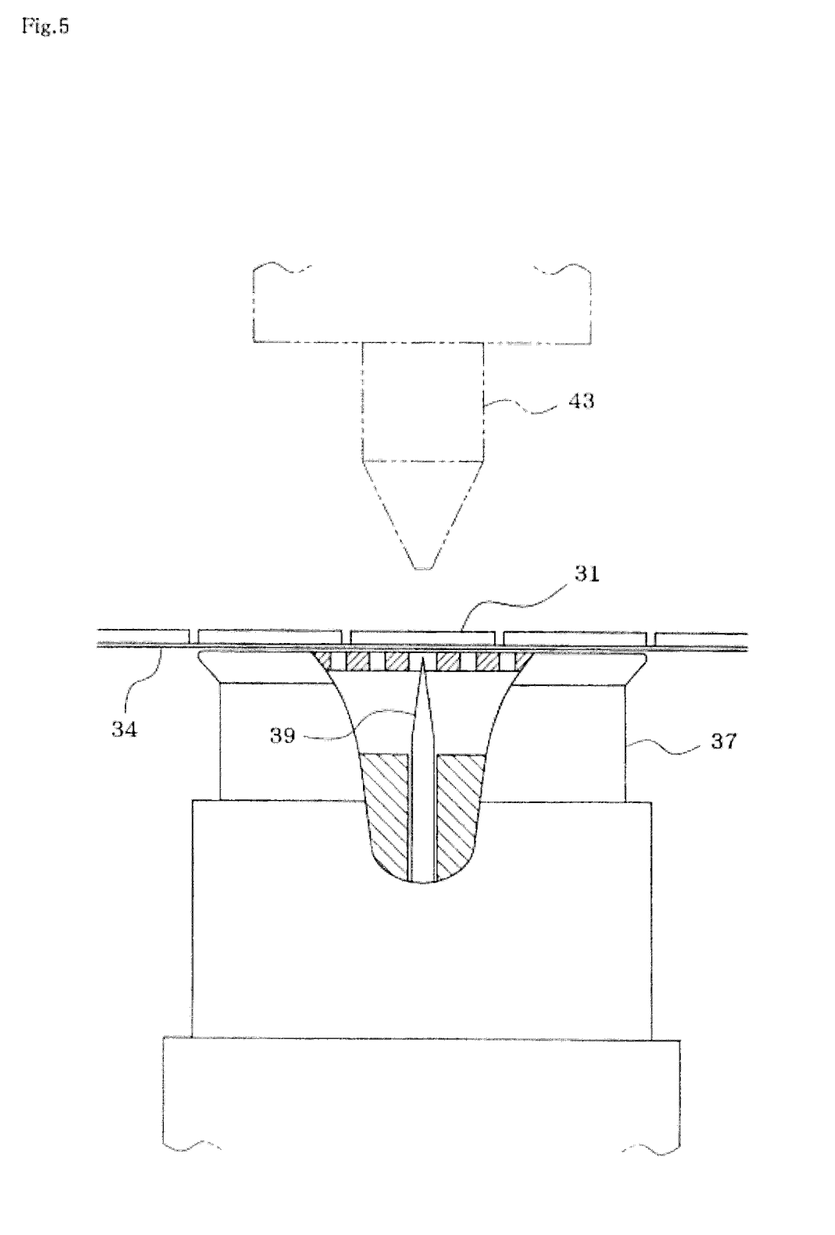
FIG. 5 is an enlarged sectional cross section diagram showing the pusher pot raised to the holding position during pusher movement.
Figure 6:
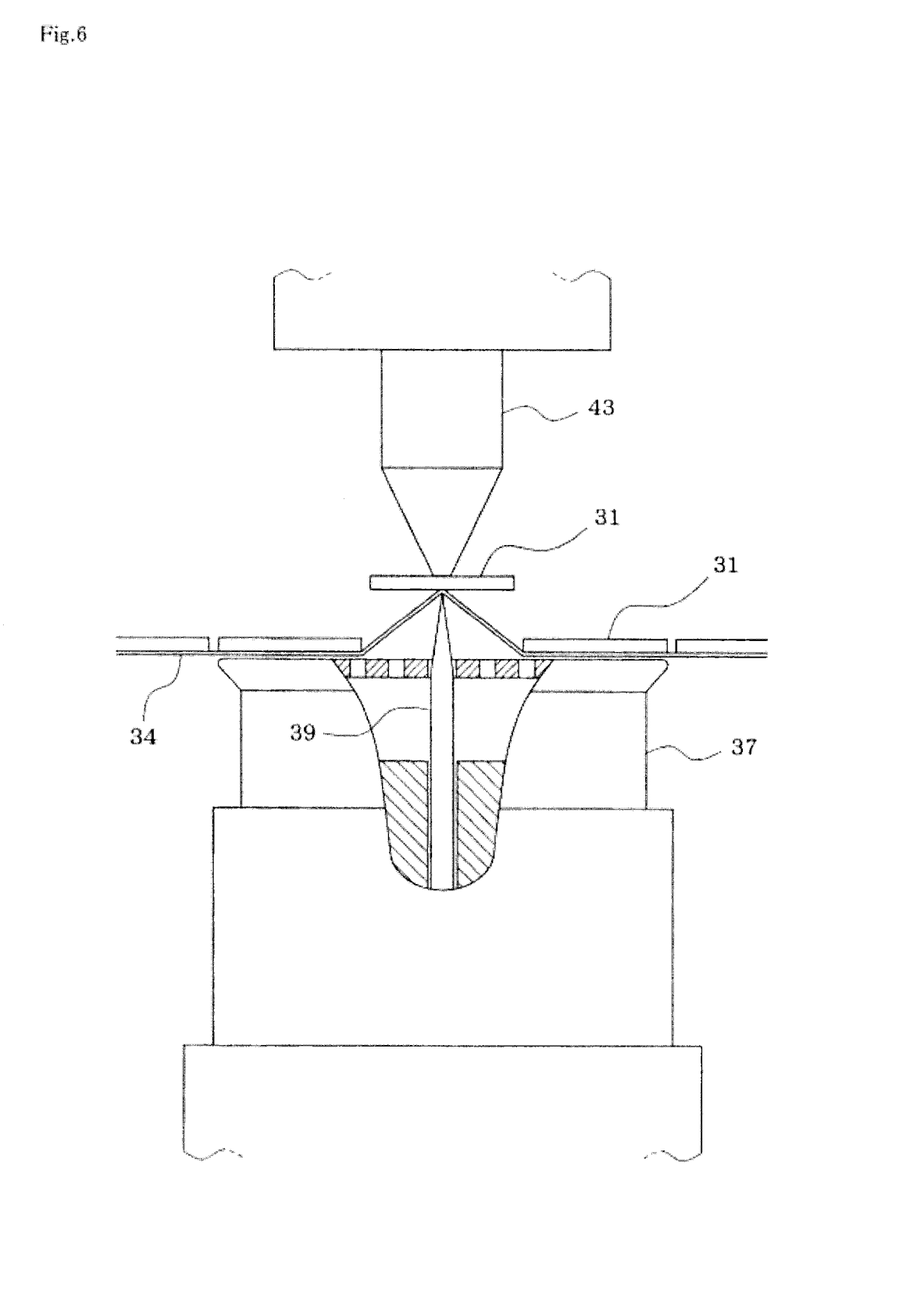
FIG. 6 is an enlarged sectional cross section diagram showing the pusher pin protruding from the pusher pot during pusher movement.

In the magazine (not shown) stored while capable of being moved up and down in magazine holding section 22 of die supply device 11, wafer pallets 32 loaded with dies 31 (wafer components) are loaded in multiple layers, such that wafer pallets 32 can be withdrawn from the magazine onto pallet withdrawal table 23 during production. As shown in FIG. 4, wafer pallet 32 is configured such that stretchable dicing sheet 34 affixed with dies 31 formed by a wafer having been diced into a grid-like pattern is mounted in an expanded state onto wafer affixing plate 33 which has a round aperture, and wafer affixing plate 33 is attached to pallet body 35 by items such as screws.

Pusher unit 28 (refer to FIG. 3) is configured to be capable of being moved in the XY direction in the space below dicing sheet 34 of wafer pallet 32. Further, by locally pushing up the adhesive section of die 31 on dicing sheet 34 for which pickup (picking up) is being attempted from below with pusher pin 39 (refer to FIG. 5 and FIG. 6) of pusher pot 37, the adhesive section of the die 31 is partially separated from dicing sheet 34 and is raised up so die 31 is in a state in which pickup is easy.

This pusher unit 28 is configured so that the entire pusher unit 28 moves up and down with a servo motor (not shown) as the source of the driving force. During die pickup movement, when pusher unit 28 is raised so that the upper surface of pusher pot 37 is raised to a specified sheet holding position at which it almost contacts dicing sheet 34 of wafer pallet 32, the raising of pusher unit 28 is stopped by a stopper mechanism (not shown), and when raising movement is continued further, pusher pin 39 (refer to FIG. 5 and FIG. 6) is protruded up from the upper surface of pusher pot 37 so that the adhesive section of die 31 on dicing sheet 34 which is being attempted to be picked up is pushed up. In this case, the pusher height position (pusher amount) of pusher pin 39 can be adjusted by adjusting the turning amount of the servo motor which is the source of the driving force.

As shown in FIG. 2, the configuration is such that pickup head 41 and camera 42 are assembled on XY moving mechanism 25, with pickup head 41 and camera 42 being moved together in the XY direction by the XY moving mechanism 25. Suction nozzle 43 (refer to FIG. 5 and FIG. 6) for picking up die 31 on dicing sheet 34 is provided on pickup head 41 such that it can be moved up and down. Camera 42 is such that the position of die 31 to be picked up by suction nozzle 43 can be checked by capturing an image of die 31 on dicing sheet 34 from above and image processing the captured image.

As shown in FIG. 4, pallet ID memory section 45 with the identification information of the wafer pallet 32 (hereafter referred to as "pallet ID") recorded or memorized is provided on wafer pallet 32. This pallet ID memory section 45 can be an item with codes such as barcodes or 2D codes memorized, or it can use RF tags (also known as electronic tags, IC tags, radio tags, wireless tags) for memorizing electronically, or magnetic tape for memorizing magnetically and so on.

Figure 7:
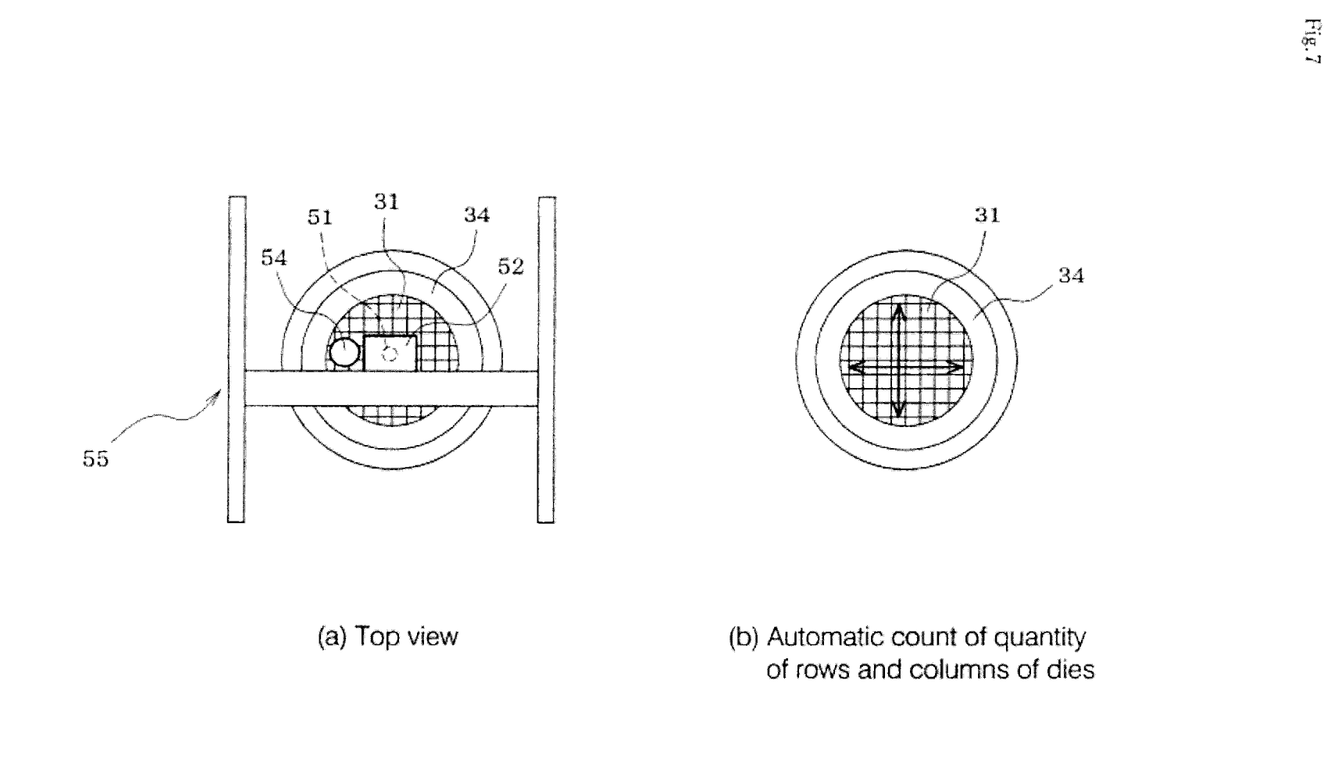
Figure 8:
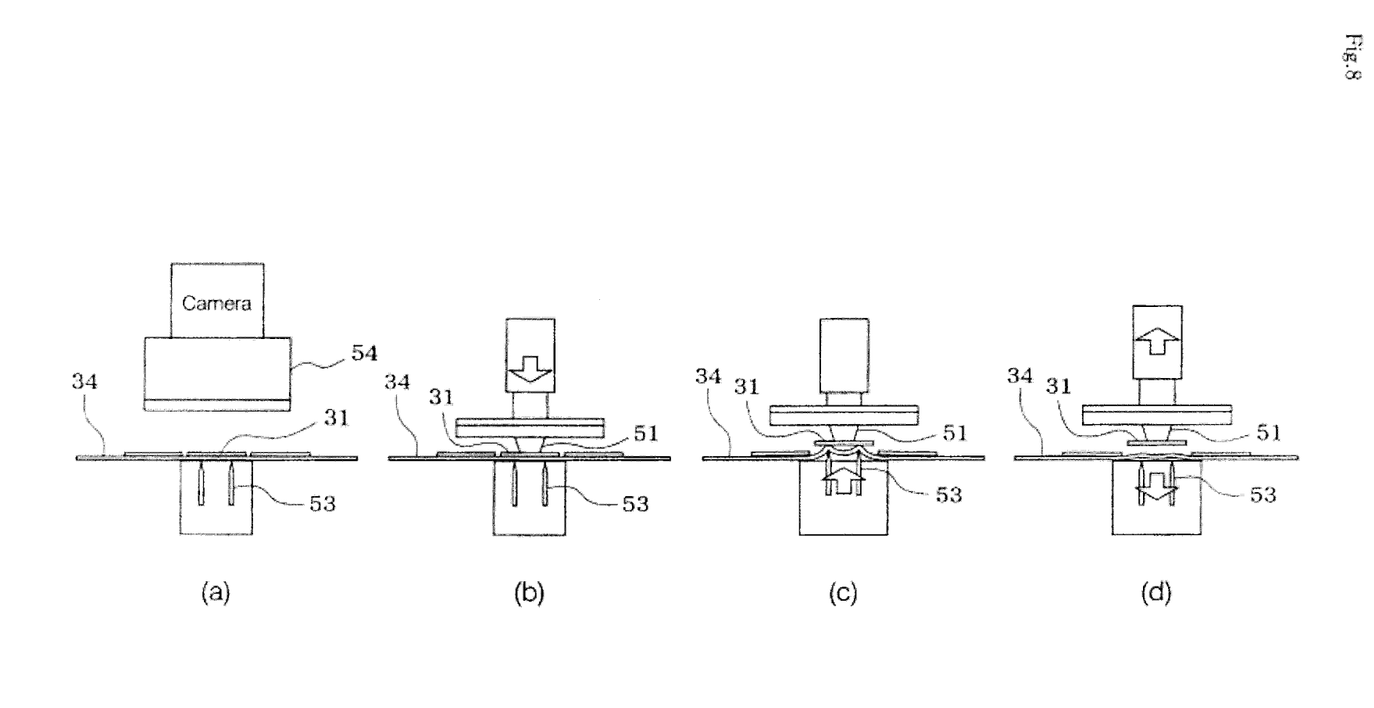

Next, as shown in FIG. 1, wafer-related data creation device 47 and data management server 48 are connected to the network connecting each component mounting line Line #1, Line #2, and Line #3. Wafer-related data creation device 47 is a device for creating wafer-related data used in die supply device 11 offline (outside the machine) and, as shown in FIG. 7 and FIG. 8, is configured comprising a setting stand (not shown) for setting wafer pallet 32 which is the target for the wafer-related data creation, pickup head 52 for holding test-use pickup nozzle 51 for picking up die 31 on dicing sheet 34 of wafer pallet 32 set on this setting stand, test-use pusher pins 53 for pushing up the adhesive section of die 31 from dicing sheet 34 which is being attempted to be picked up by the test-use suction nozzle 51, and test-use camera 54 for capturing images of die 31 on dicing sheet 34. Pickup head 52 and test-use camera 54 are configured such that they are moved together in the XY direction by XY moving mechanism 55.

Test-use camera 54, test-use pusher pins 53, and test-use pickup nozzle 51 of wafer-related data creation device 47 use items with the same functional specifications as camera 42, pusher pin 39, and pickup nozzle 43 of die supply device 11 respectively, and are capable of being changed to match camera 42, pusher pin 39, and pickup nozzle 43 of die supply device 11. The quantity of test-use pusher pins 53 of wafer-related data creation device 47 is also capable of being changed to match the quantity of pusher pins 39 of die supply device 11.

Next, the following describes the procedure for creation (setup) of wafer-related data using wafer-related data creation device 47.

First, initial values (provisional values before tuning) for wafer-related data required to operate wafer-related data creation device 47 are entered into the control device (not shown) of wafer-related data creation device 47.

After this, image processing data is created and image processing testing is performed. For the image processing data creation method, wafer pallet 32 which is the target for the wafer-related data creation is set on the setting stand, an image of the wafer (die 31) on dicing sheet 34 on that wafer pallet 32 is captured from above by test-use camera 54, the image of the wafer is imported and image processed, the form of the wafer (die 31) is recognized using the initial values (provisional values before tuning) of the image processing data, and the image processing data (the size and so on of die 31 and the wafer) is created. Then, using the created image processing data, a test is performed of image processing to recognize the form of die 31 from the image of the wafer captured by test-use camera 54, and the image processing data is tuned until the form of die 31 can be recognized stably.

After this, the quantity of rows and columns of dies 31 on dicing sheet 34 is counted automatically. Here, the quantity of rows and columns of dies 31 is sought by counting the number of dies 31 while image processing dies 31 one by one along a straight line running through the center of the circle of the wafer on dicing sheet 34. This count is performed on lines in the horizontal direction (X direction) and vertical direction (Y direction) respectively and seeks the quantity of rows and columns in the horizontal direction and vertical direction.

After this, push movement of test-use pusher pins 53 and die pickup movement of test-use suction nozzle 51 of wafer-related data created device 47 is performed and push-related data is created. Here, in order to detect the position of die 31 being attempted to be picked up by test-use suction nozzle 51, first, as shown in FIG. 8(a), an image of die 31 being attempted to be picked up by test-use suction nozzle 51 is captured by test-use camera 54, the image of die 31 is imported and image processed, and the position of die 31 is detected.

After this, as shown in FIG. 8(b), test-use suction nozzle 51 is lowered and picks up die 31. After this, as shown in FIG. 8(c), test-use pickup nozzle 51 is raised while partially separating the adhesive section of the die 31 from dicing sheet 34 by raising test-use pusher pins 53 to raise the adhesive section of the die with pusher pins 53. From this, as shown in FIG. 8(d), after die 31 has been separated from dicing sheet 34, test-use pusher pins 53 are lowered and returned to their original position. By these operations push-related data is tuned.

Figure 9:
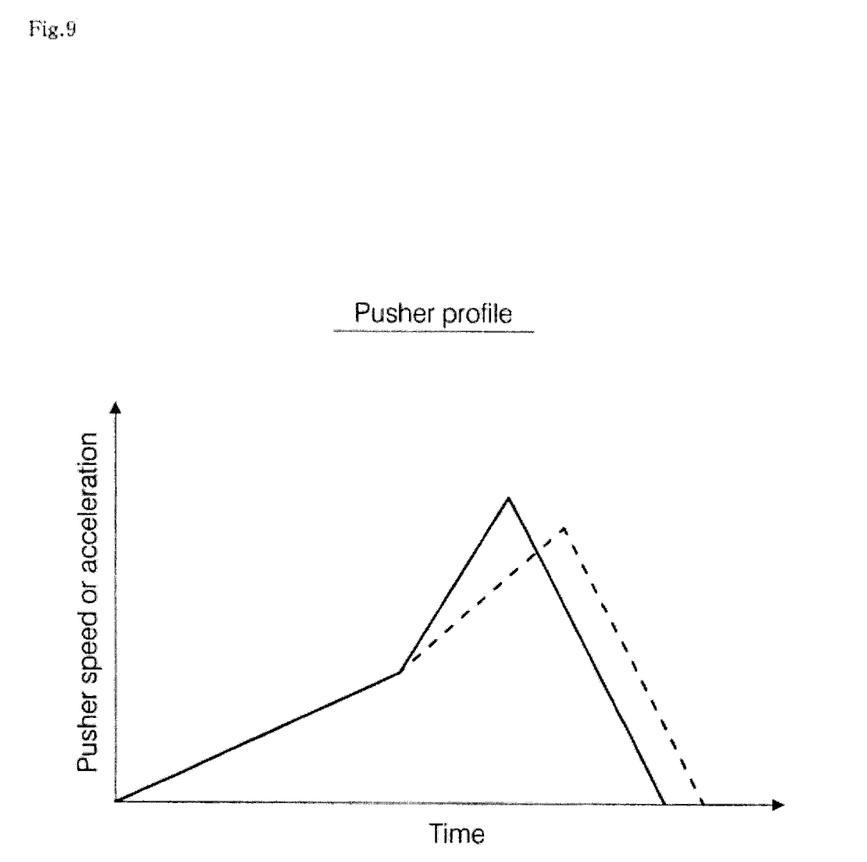
FIG. 9 is a diagram showing a setting example for a push profile.

Here, push-related data to be tuned is the push amount, push profile and so on of pusher pin 39 (test-use pusher pin 53). The push profile, as shown in FIG. 9, is the push speed or the table specifying the acceleration rate over time of pusher pin 39 (test-use pusher pin 53), so that the push speed (acceleration) can be changed during push movement. The behavior (speed or acceleration) for push movement of pusher pin 39 (test-use pusher pin 53) is specified by this push profile. When the push speed (acceleration) is changeable during push movement, it is preferable, for example, to raise with a slow push speed at the beginning of push movement and then increasing the push speed further at some point, or, conversely, to decrease the push speed at some point during push movement. It is preferable to be able to specify the height position at which the push speed (acceleration) is changeable.

In addition to this, it is preferable to be able to specify pusher pot 37 type (form, diameter), pusher pin 39 form, pin arrangement, and so on as push-related data.

Also, the pickup start position of die 31 on dicing sheet 34 is set as follows. First, as shown in FIG. 10(*a*), images of reference dies R to be used as a reference point on dicing sheet 34 of wafer pallet 32 are captured from above by test-use camera 54, the positions of reference dies R are detected using image processing, and the center position of the wafer is sought using the position of two positioning pins 61 and 62 as a reference.

Figure 10:
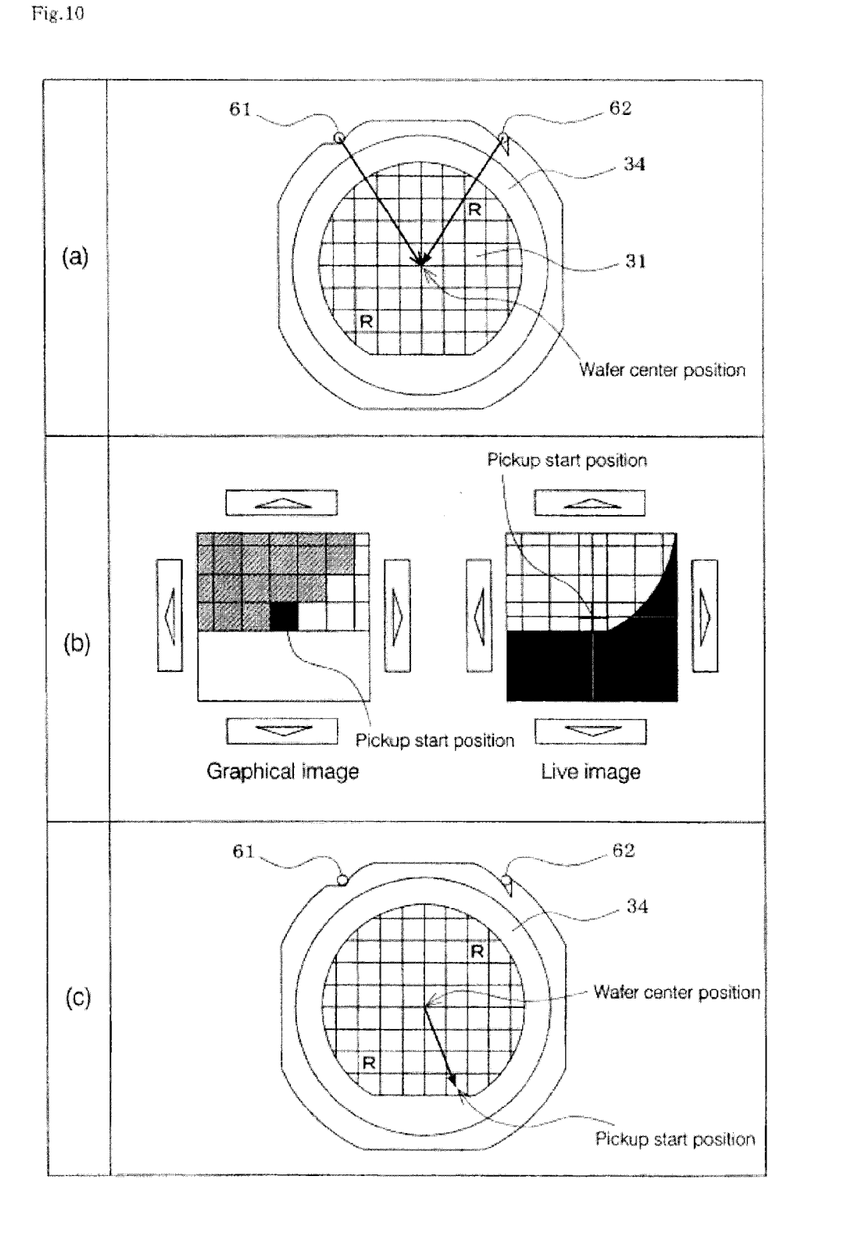

After this, as shown in FIG. 10(*b*), the pickup start position is set such as by operating a mouse while looking at a graphical image and a live image of the wafer on the monitor screen of the wafer-related data creation device 47. After this, as shown in FIG. 10(*c*), the coordinates of the pickup start position which uses the wafer center position as the origin point are calculated.

The wafer-related data (image processing data, quantity of rows and columns of dies 31, push-related data, die 31 pickup start position, and so on) created in wafer-related data creation device 47 as given above, is transmitted to data management server 48 and memorized with the wafer-related data linked to the pallet ID. Further, when wafer-related data is created using die supply device 11 in the same as the conventional way, stopping one of component mounting lines Line #1, Line #2, or Line #3 during production, it is preferable to also memorize this wafer-related data linked to the pallet ID in data management server 48.

This data management server 48 is a server for unified management of wafer-related data used at each component mounting line Line #1, Line #2, and Line #3, and along with registering wafer mapping data in wafer map converter 57 started in the data management server 48, the wafer map file is converted into a readable file using the wafer map converter 57 and stored in data management server 48.

Each of component mounting lines Line #1, Line #2, and Line #3, and die supply device 11 are equipped with a reader (pallet ID reading means) which reads the pallet ID from pallet ID memory section 45 of wafer pallet 32. During production of each component mounting line Line #1, Line #2, and Line #3, the pallet ID is read by the reader from pallet ID memory section 45 of wafer pallet 32 set on die supply device 11, the map data and wafer-related data corresponding to the pallet ID is searched from the memorized data of data management server 48 and automatically downloaded to the die supply device 11, and the die supply device 11 is controlled using the wafer-related data. Further, when a partially-used wafer pallet 32 is removed from die supply device 11, the map data is uploaded to data management server 48 from that die supply device 11.

As described above in embodiment 1, because wafer-related data is created using wafer-related data creation device 47 equipped with test-use pickup nozzle 51, test-use pusher pin 53, and test-use camera 54, data related to push movement of the pusher pin 39 and die pickup movement of suction nozzle 51 can be set up offline, preparation (wafer-related data setup) for the next changeover can be performed during production, and productivity can be improved.

Furthermore, because the wafer-related data created in wafer-related data creation device 47 is linked to the pallet ID and memorized in data management server 48, it is possible to search the wafer-related data corresponding to the pallet ID of wafer pallet 32 set in die supply device 11 of component mounting lines Line #1, Line #2, and Line #3 from the memorized data of data management server 48 and download it automatically to die supply device 11. By this, the work of entering the wafer-related data which corresponded to the pallet ID into die supply device 11 can be automated, and the demand to save labor can be met.

Further, in embodiment 1, because data management server 48 is connected via a network to multiple component mounting lines Line #1, Line #2, and Line #3 to enable unified management of wafer-related data, it is possible to share wafer-related data created in wafer-related data creation device 47 with multiple component mounting lines Line #1, Line #2, and Line #3, so it is not necessary to create wafer-related data in wafer-related creation device 47 separately for each component mounting line Line #1, Line #2, and Line #3, meaning wafer-related data setup time can be reduced, and downtime due to component mounting line changeover can be decreased. Also, by performing all setup for wafer-related data in advance, non-stop replenishment of wafer pallets 32 is possible.

However, for the present invention, it is also acceptable to connect data management server 48 via a network to only one component mounting line.

Embodiment 2

In embodiment 1 above, wafer-related data created in wafer-related data creation device 47 was memorized in data management server 48, but in embodiment 2 of the present invention, a data memorizing means for memorizing wafer-related data created in wafer-related data creation device 47 is equipped on wafer pallet 32, and component mounting line or die supply device 11 is equipped with a reader (data reading means) for reading wafer-related data from the data memorizing means of wafer pallet 32, and die supply device 11 is controlled using the wafer-related data read by the reader. The data memorizing means for memorizing wafer-related data can use an item such as an RF tag (also known as electronic tags, IC tags, radio tags, wireless tags) for memorizing electronically. Other items are the same as the above embodiment 1.

In embodiment 2 described above also, the work of entering the wafer-related data which corresponded to the pallet ID into die supply device 11 can be automated, and the demand to save labor can be met.

Furthermore, it goes without saying that the present invention is not limited to the above embodiments 1 and 2, and various embodiments with changes that do not extend beyond the scope of the invention are possible such as those with changes to the contents of the wafer-related data created in wafer-related data creation device 47.

REFERENCE SIGNS LIST

Line #1, Line #2, Line #3: Component mounting lines; 11: Die supply device; 12: Mounter; 13: Tape feeder; 14: Mounter; 16, 17: Line management computer; 18: Host computer; 31: Die; 32: Wafer pallet; 33: Wafer affixing plate; 34: Dicing sheet; 37: Pusher pot; 39: Pusher pin; 41: Pickup head; 42: Camera; 43: Pickup nozzle; 45: Pallet ID memory section; 47: Wafer-related data creation device; 48: Data management server; 51: Test-use pickup nozzle; 52: Pickup head; 53: Test-use pusher pin; 54: Test-use camera; 55: XY moving mechanism

The invention claimed is:

1. A wafer-related data management method which manages wafer-related data used by a die supply device which performs pickup of a die of multiple dies from a wafer pallet that includes a wafer on a dicing sheet diced into the multiple dies, by picking up with a suction nozzle while partially separating an adhesive section of the die from the dicing sheet by using a pusher pin to raise the adhesive section, which is done when lowering the suction nozzle, the wafer-related data management method comprising:
creating the wafer-related data using a wafer-related data creation device comprising a setting stand for setting a target wafer pallet which is the target for the wafer-related data creation, a test-use suction nozzle for picking up a die on a dicing sheet of the target wafer pallet set on the setting stand, a test-use pusher pin for pushing up an adhesive section of the die on the dicing sheet of the target wafer pallet which is being attempted to be picked up by the test-use suction nozzle, and a test-use camera for capturing images of the die on the dicing sheet of the target wafer pallet;
processing the image captured by the test-use camera;
performing push movement of the test-use pusher pin and die pickup movement of the test-use suction nozzle; and
storing the wafer-related data created by the wafer-related data creation device in a memory and linking the wafer-related data with a pallet ID of the wafer pallet from which the wafer-related data was created.

2. The wafer-related data management method according to claim 1, wherein the wafer-related data includes at least one of image processing-related data, data related to push movement of the pusher pin, and data related to die pickup movement of the suction nozzle.

3. The wafer-related data method according to claim 1, wherein the pallet ID is a memory section of the wafer pallet,
wherein a data management server for storing the link between the wafer-related data created in the wafer-related data creation device and the pallet ID is connected via a network to a component mounting line in which the die supply device is arranged, and the component mounting line or the die supply device is equipped with a pallet ID reading means for reading the pallet ID from the memory section of the wafer pallet, and
wherein the die supply device is controlled by searching for the wafer-related data corresponding to the pallet ID read by the pallet ID reading means from the memorized data of the data management server and transmitting it to the die supply device.

4. The wafer-related data management method according to claim 3, wherein the data management server is connected via a network to multiple component mounting lines.

5. The wafer-related data management method according to claim 1, wherein the wafer pallet is equipped with a data memorizing means for memorizing the wafer-related data created in the wafer-related data creation device, a component mounting line or the die supply device is equipped with a data reading means for reading the wafer-related data from the data memorizing means of the wafer pallet, and the wafer-related data read by the data reading means is used to control the die supply device.

6. A wafer-related data management method which manages wafer-related data used by a die supply device which performs pickup of a die of multiple dies from a wafer pallet that includes a wafer on a dicing sheet diced into the multiple dies, by picking up with a suction nozzle while partially separating an adhesive section of the die from the dicing sheet by using a pusher pin to raise the adhesive section, which is done when lowering the suction nozzle, the wafer-related data management method comprising:
creating the wafer-related data using a wafer-related data creation device comprising a setting stand for setting a target wafer pallet which is the target for the wafer-related data creation, a test-use suction nozzle for picking up a die on a dicing sheet of the target wafer pallet set on the setting stand, a test-use pusher pin for pushing up an adhesive section of the die on the dicing sheet of the target wafer pallet which is being attempted to be picked up by the test-use suction nozzle, and a test-use camera for capturing images of the die on the dicing sheet of the target wafer pallet,
wherein the target wafer pallet which is the target for the wafer-related data creation is set on the setting stand, the image captured by the test-use camera is processed, push movement of the test-use pusher pin and die pickup movement of the test-use suction nozzle are performed, the wafer-related data is created and stored in a memory, and the wafer-related data is linked with a pallet ID of the wafer pallet from which the wafer-related data was created.

7. The wafer-related data method according to claim 6, wherein the pallet ID is a memory section of the wafer pallet,
wherein a data management server for storing the link between the wafer-related data and the pallet ID is connected via a network to a component mounting line in which the die supply device is arranged, and the component mounting line or the die supply device is equipped with a pallet ID reading means for reading the pallet ID from the memory section of the wafer pallet, and
wherein the die supply device is controlled by searching for the wafer-related data corresponding to the pallet ID read by the pallet ID reading means from the memorized data of the data management server and transmitting it to the die supply device.

8. The wafer-related data management method according to claim 7, wherein the data management server is connected via a network to multiple component mounting lines.

9. The wafer-related data management method according to claim 6, wherein the wafer pallet is equipped with a data memorizing means for memorizing the wafer-related data, a component mounting line or the die supply device is equipped with a data reading means for reading the wafer-related data from the data memorizing means of the wafer pallet, and the wafer-related data read by the data reading means is used to control the die supply device.

* * * * *